(12) United States Patent
Takeuchi

(10) Patent No.: US 7,911,003 B2
(45) Date of Patent: Mar. 22, 2011

(54) SEMICONDUCTOR INTEGRATED CIRCUIT DEVICE

(75) Inventor: Kazutaka Takeuchi, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/512,229

(22) Filed: Aug. 30, 2006

(65) Prior Publication Data

US 2007/0228474 A1    Oct. 4, 2007

(30) Foreign Application Priority Data

Mar. 31, 2006   (JP) .................................. 2006-099247

(51) Int. Cl.
*H01L 23/62* (2006.01)
(52) U.S. Cl. ........ 257/371; 257/372; 257/373; 257/368; 257/369; 257/375; 257/376
(58) Field of Classification Search .................. 257/371, 257/369, 368, 372, 373, 375, 376
See application file for complete search history.

(56) References Cited

U.S. PATENT DOCUMENTS

| | | | | |
|---|---|---|---|---|
| 5,473,183 A | * | 12/1995 | Yonemoto | 257/371 |
| 5,583,363 A | * | 12/1996 | Momose et al. | 257/378 |
| 5,905,292 A | * | 5/1999 | Sugiura et al. | 257/402 |
| 6,023,186 A | * | 2/2000 | Kuroda | 327/534 |
| 6,140,686 A | * | 10/2000 | Mizuno et al. | 257/369 |
| 2006/0038584 A1 | * | 2/2006 | Mitsuda | 326/33 |
| 2007/0228474 A1 | * | 10/2007 | Takeuchi | 257/355 |

FOREIGN PATENT DOCUMENTS

JP   2004-228466 A   8/2004

* cited by examiner

*Primary Examiner* — Wai-Sing Louie
*Assistant Examiner* — Bilkis Jahan
(74) *Attorney, Agent, or Firm* — Westerman, Hattori, Daniels & Adrian, LLP

(57) ABSTRACT

A semiconductor integrated circuit device including a semiconductor substrate and a MOS transistor having a source diffusion region and a drain diffusion region formed in the semiconductor substrate. A well is formed in the semiconductor substrate. A back gate diffusion region is defined in the vicinity of the source diffusion region or the drain diffusion region. The back gate diffusion region is of a conductivity type that is the same as that of the source diffusion region or the drain diffusion region. A potential control layer, arranged in the semiconductor substrate or under the well, controls the potential at the semiconductor substrate or the well.

14 Claims, 7 Drawing Sheets

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-099247, filed on Mar. 31, 2006, the entire contents of which are incorporated herein by reference.

BACKGROUND OF THE INVENTION

The present invention relates to a semiconductor integrated circuit device, and more particularly, to an improvement of a transistor in a semiconductor integrated circuit device to which a substrate bias or a well bias is applied.

Japanese Laid-Open Patent Publication No. 2004-228466 describes a semiconductor integrated circuit device including a MOS transistor (MOSFET). The configuration of the conventional semiconductor integrated circuit device will now be described with reference to FIG. 1.

The semiconductor substrate 200 of FIG. 1 is, for example, a P-type silicon substrate. An N well 210 is formed in part of the semiconductor substrate 200. The N well 210 includes a source region 211S and a drain region 211D, each formed by a $p^+$ diffusion layer. An insulative film 230 is formed on the semiconductor substrate 200. A gate electrode 241 made of, for example, polysilicon is formed on the insulative film 230. The source region 211S, the drain region 211D, and the gate electrode 241 form a PMOS transistor T1. The N well 210 further includes a back gate region 212 formed by an $n^+$ diffusion layer to obtain the substrate bias or the well bias of the transistor T1.

Similarly, the semiconductor substrate 200 includes a P-type region (P well) 220 in the vicinity of the N well 210. The P-type region 220 includes a source region 221S and a drain region 221D, each formed by an $n^+$ diffusion layer. A gate electrode 242 is formed on the insulative film 230. The source region 221S, the drain region 221D, and the gate electrode 242 form an NMOS transistor T2. The P well 220 further includes a back gate region 222 formed by a $p^+$ diffusion layer to obtain the substrate bias or the well bias of the transistor T2.

An interlayer insulative film 250 is superimposed on the insulative film 230. Contact holes H extend through the interlayer insulative film 250 and the insulative film 230. Each contact hole H is filled with part of wiring 260 made of, for example, aluminum (Al) alloy. The wiring 260 is electrically connected to the source regions 211S and 221S, the drain regions 211D and 221D, and the back gate regions 212 and 222 of the MOS transistors T1 and T2. The source region 211S of the PMOS transistor T1 is connected to a power supply line $V_{DD}$, and the source region 221S of the NMOS transistor T2 is connected to a ground line $V_{SS}$ by the wiring 260. The combination of the MOS transistors T1 and T2 realize a CMOS configuration.

The back gate region 212 of the PMOS transistor T1 is connected to the power supply line $V_{DD}$, and the back gate region 222 of the NMOS transistor T2 is connected to the ground line $V_{SS}$. This ensures that the substrate bias or the well bias of each transistor T1 and T2 is obtained.

The above configuration ensures the substrate bias or the well bias of each MOS transistor. However, the source regions 211S and 221S are electrically short-circuited by the back gate regions 212 and 222, respectively. This increases leakage current between the source and drain in the transistors T1 and T2.

FIG. 2 shows a second conventional example of a semiconductor integrated circuit device that reduces the leakage current. In this semiconductor integrated circuit device, the source potential and the well potential are independently controlled. With regards to the PMOS transistor T1, for example, an N well control layer (potential control layer) 213 for independently controlling the potential of the N well 210 is arranged under the N well 210. The leakage current between the source and the drain in the transistor T1 is reduced by applying a potential $V_{BC}$, which is higher than the potential $V_{DD}$ applied to the source region 211S, to the N well control layer 213.

SUMMARY OF THE INVENTION

When designing a semiconductor integrated circuit device, the function and performance of the semiconductor integrated circuit device are determined in a function design step. A logic circuit design step for realizing the function and the performance is subsequently performed. The operation of the semiconductor integrated circuit device is checked by repeating simulations with a logic circuit generated in the logic circuit design step. When determined that the logic circuit is functioning normally, a photomask pattern or a pattern layout diagram is generated based on the logic circuit diagram. A design rule check or electrical connection check is performed on the pattern layout diagram. If everything is normal, a layout design step is performed to convert the pattern layout diagram to mask data, which is used for manufacturing.

FIG. 3 shows a pattern layout diagram corresponding to the plan view of the semiconductor integrated circuit device shown in FIG. 1. The layout pattern of the wiring 260 is omitted in the pattern layout diagram.

The pattern layout diagram of FIG. 3 is formed by superimposing a plurality of layers L11 to L15, which are shown in FIGS. 4(A) to 4(E). The layer L11 of FIG. 4A includes a layout pattern PT210 of the N well 210. The layer L12 of FIG. 4B includes layout patterns PT241 and PT242 of the gate electrodes 241 and 242. The layer L13 of FIG. 4C corresponds to the $p^+$ diffusion layer and includes a layout pattern PT211 of the source-drain region of the PMOS transistor T1 and a layout pattern PT222 of the back gate region 222 of the NMOS transistor T2. The layer L14 of FIG. 4D corresponds to the $n^+$ diffusion layer and includes a layout pattern PT212 of the back gate region 212 of the PMOS transistor T1 and a layout pattern PT221 of the source-drain region of the NMOS transistor T2. The layer L15 of FIG. 4E includes layout patterns PTH of the contact holes H.

As described above, a large amount of time including the time required in the function design step and the logic circuit design step is necessary before completing the mask data for manufacturing of the semiconductor integrated circuit device.

The layout designing of the semiconductor integrated circuit device of FIG. 2 may be performed by merely adding a layer including a layout pattern of the N well control layer 213 to the pattern layout diagram (e.g., FIG. 3) of an existing semiconductor integrated circuit device. Thus, the design time is greatly shortened since the designing of the semiconductor integrated circuit device of FIG. 2 may start from layout designing.

However, the back gate regions 212 and 222 shown in FIG. 1 are not necessary in the semiconductor integrated circuit device of FIG. 2. Thus, when correcting the pattern layout diagram for the semiconductor integrated circuit device shown in FIG. 1 to the pattern layout diagram for the semiconductor integrated circuit device shown in FIG. 2, the layout patterns PT212 (FIG. 4D) and PT222 (FIG. 4C) respectively corresponding to the back gate regions 212 and 222 must be deleted from the layers L13 and L14. Further, the layout patterns PTH (FIG. 4E) corresponding to the contact holes H must be deleted from the layer L15. Increase in the production cost is thus inevitable since a great amount of time is required for the corrections.

One aspect of the present invention is a semiconductor integrated circuit device including a semiconductor substrate. A MOS transistor includes a source diffusion region and a drain diffusion region formed in the semiconductor substrate. A well is formed in the semiconductor substrate. A back gate diffusion region is defined in the vicinity of the source diffusion region or the drain diffusion region. The back gate diffusion region is of a conductivity type that is the same as that of the source diffusion region or the drain diffusion region. A potential control layer, arranged in the semiconductor substrate or under the well, controlling the potential at the semiconductor substrate or the well.

In one aspect of the present invention, the conductivity type of the back gate diffusion region is the same as the conductivity types of the source diffusion region and the drain diffusion region arranged next to each other in the same transistor. The back gate diffusion region is electrically connected to the source diffusion region or the drain diffusion region by a contact hole and wiring. Thus, the layout patterns PTH for forming the contact holes shown in FIG. 4E may be used without performing correction. Furthermore, at least some of the layout patterns for forming wiring (not shown) may be used for other purposes. Thus, a new exclusive layout pattern for inhibiting the formation of the contact holes connected to the back gate diffusion region does not need to be prepared, and the design time of the semiconductor integrated circuit device is not increased. Further, the substrate bias or the well bias is accurately controlled due to the potential control layer used in place of the back gate. Thus, the substrate potential or the well potential is controlled independent from the source potential.

In one aspect of the present invention, a plurality of potential control layers having the same conductivity form a network in an LSI including a vast number of MOS transistors. The network supplies bias to the plurality of potential control layers to easily control the vast number of MOS transistors.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor integrated circuit device according to a preferred embodiment of the present invention will now be described with reference to FIGS. 5 to 8.

Figure 5:
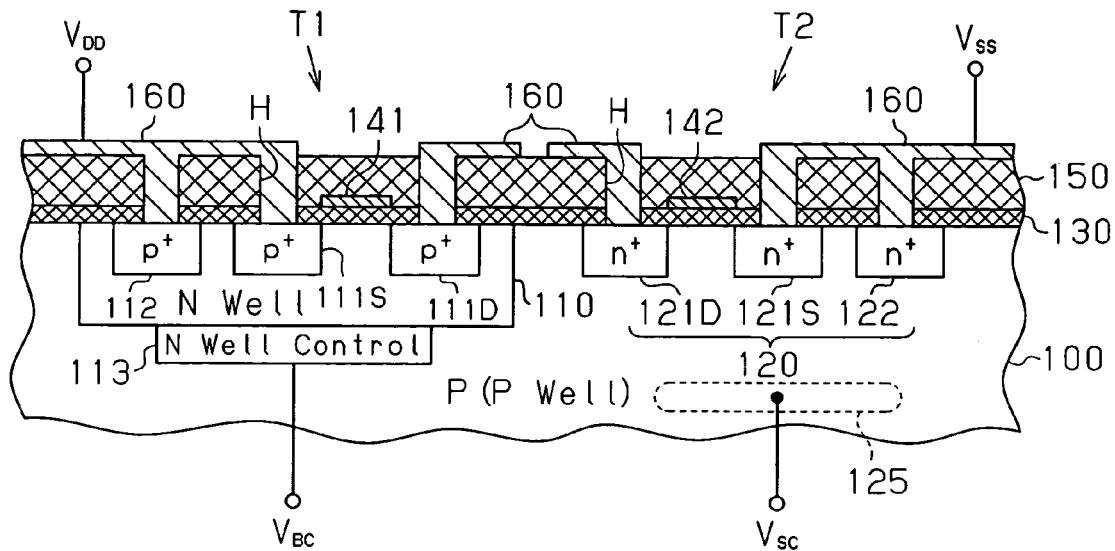
FIG. 5 is a partially enlarged cross-sectional view of a semiconductor integrated circuit device according to a preferred embodiment of the present invention.

The semiconductor integrated circuit device of FIG. 5 includes a semiconductor substrate 100, which is a P-type silicon substrate. An N well 110 is formed in the semiconductor substrate 100. A PMOS transistor T1 is formed by the N well 110. An NMOS transistor T2 is formed near the PMOS transistor T1. The NMOS transistor T2 is formed by a P-type region (P well) 120 in the semiconductor substrate 100. A device isolation insulative film (not shown) is arranged between the PMOS transistor T1 and the NMOS transistor T2.

The PMOS transistor T1 will now be described. The PMOS transistor T1 includes a source region 111S, a drain region 111D, and a gate electrode 141 formed from, for example, polysilicon. The source region 111S and the drain region 111D are formed by a $p^+$ diffusion layer in the N well 110. The gate electrode 141 is formed on a gate insulative film 130, which is formed on the semiconductor substrate 100. A back gate diffusion region 112 for obtaining the well bias of the transistor T1 is formed in the N well 110. In the preferred embodiment, the back gate diffusion region 112 and the adjacent source region 111S are of the same conductivity type and formed by, for example, a $p^+$ diffusion layer.

The gate insulative film 130 and an interlayer insulative film 150 are superimposed on the N well 110 of the semiconductor substrate 100. A plurality of contact holes H extend through the interlayer insulative film 150 and the gate insulative film 130. The contact holes H electrically connect wiring 160 made of, for example, aluminum (Al) alloy to the source region 111S, the drain region 111D, and the back gate diffusion region 112. The source region 111S and the back gate diffusion region 112 are connected to a power supply line $V_{DD}$ by the wiring 160.

The back gate diffusion region 112 is a p+ diffusion layer of the same conductivity type as the source region 111S. Thus, the back gate diffusion region 112 does not function to obtain the well bias (well potential). Therefore, an N well control layer (potential control layer) 113 for controlling potential $V_{BC}$ at the N well 110 is embedded underneath the N well 110 in the preferred embodiment. The N well control layer 113 ensures the controllability of the well potential and controls the well potential $V_{BC}$ independently from the potential $V_{DD}$ applied to the source region 111S. For example, the potential $V_{BC}$, which is higher than the potential $V_{DD}$ applied to the source region 111S, may be applied to the N well 110 through the N well control layer 113. This reduces the leakage current between the source and the drain in the transistor T1. Further, the layout pattern of the contact hole H connected to the back gate diffusion region 112 does not need to be deleted from the pattern layout diagram during layout designing by using the back gate diffusion region 112 as a dummy region. Therefore, the increase in the design time caused by layout correction is minimized.

The NMOS transistor T2 will now be described. The NMOS transistor T2 includes a source region 121S, a drain region 121D, and a gate electrode 142 made of, for example, polysilicon. The source region 121S and the drain region 121D are formed by an n⁺ diffusion layer in the P-type region (P well) 120. A gate electrode 142 is formed on the gate insulative film 130.

A back gate diffusion region 122 for obtaining the substrate bias (substrate potential) of the transistor T2 is formed in the P-type region (P well) 120. The back gate diffusion region 122 and the adjacent source region 121S are of the same conductivity type and are formed by, for example, an n⁺ diffusion layer.

In the NMOS transistor T2, the wiring 160 is electrically connected to the source region 121S, the drain region 121D, and the back gate diffusion region 122 by contact holes H extending through the interlayer insulative film 150. The source region 121S and the back gate diffusion region 122 are connected to a ground line $V_{SS}$ by the wiring 160. For the same reasons as the back gate diffusion region 112, the back gate diffusion region 122 does not function to obtain the substrate bias (substrate potential). Thus, a portion 125 functioning as a substrate potential control layer for controlling the potential of the P-type region (P well) 120 of the NMOS transistor T2, or the potential of the semiconductor substrate 100, is provided in the preferred embodiment. The portion 125 ensures the controllability of the substrate bias (substrate potential), and the substrate potential $V_{SC}$ is controlled independently from the potential $V_{SS}$ applied to the source region 121S. For example, substrate potential $V_{SC}$, which is lower than the potential $V_{SS}$ applied to the source region 121S, is applied to the source region 121S. This reduces the leakage current between the source and the drain in the transistor T2. Further, the layout pattern of the contact hole H connected to the back gate diffusion region 122 does not need to be deleted from the pattern layout diagram during layout designing by using the back gate diffusion region 122 as a dummy region. Therefore, the increase in design time caused by layout correction is minimized.

The configuration of the semiconductor integrated circuit device and the layout of the N well control layer 113 will now be described with reference to FIG. 6.

Figure 6:
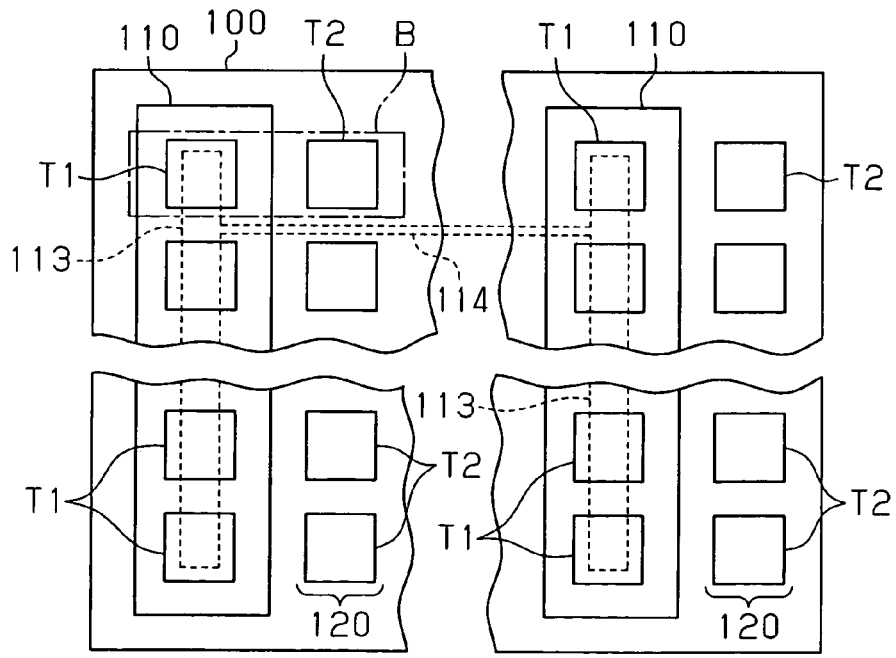
FIG. 6 is a plan view showing the semiconductor integrated circuit device of FIG. 5.

As shown in FIG. 6, the semiconductor integrated circuit device includes a plurality of the N wells 110. The N wells 110 are laid out in predetermined intervals, and each N well 110 extends in a first direction along the surface of the semiconductor substrate 100. A plurality of the PMOS transistors T1 are aligned in the first direction in each N well 110. The PMOS transistors T1 are formed at predetermined intervals with device isolation films (not shown) arranged in between. In each P-type region (P well) 120 adjacent to each N well 110, a plurality of the NMOS transistors T2 are formed in the first direction with device isolation films (not shown) arranged in between. In the preferred embodiment, as shown in box B, a PMOS transistor T1 and an NMOS transistor T2 adjacent to the PMOS transition T1 in the second direction forms a CMOS configuration.

A plurality of the N well control layers 113 are respectively formed under the N wells 110. Each N well control layer 113 controls the potential of the corresponding N well 110 and extends in the first direction. The N well control layers 113 are electrically connected to one another by a connection layer 114 extending in the second direction to form a network. The network collectively controls the well potential $V_{BC}$ of a vast number of PMOS transistors formed in each of the plurality of N wells 110.

Figure 7:
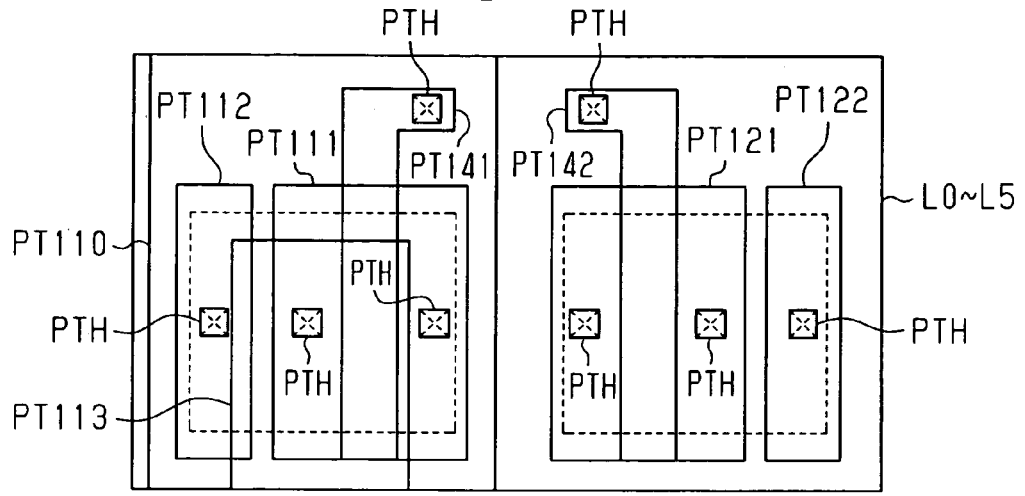
FIG. 7 is a pattern layout diagram of the semiconductor integrated circuit device of FIG. 5.

The method for designing the semiconductor integrated circuit device, in particular, the design procedures related to the pattern layout diagram according to the preferred embodiment will now be described. FIG. 7 is a pattern layout diagram generated when layout designing the portion of box B in FIG. 6. FIGS. 8(A) to 8(F) respectively show layers L0 to L5 of FIG. 7. The layout pattern of the wiring 160 is not shown in the pattern layout diagram of FIG. 7. Two boxes shown by broken lines in FIG. 7 each represent the regions of the transistors T1 and T2.

Figure 1:
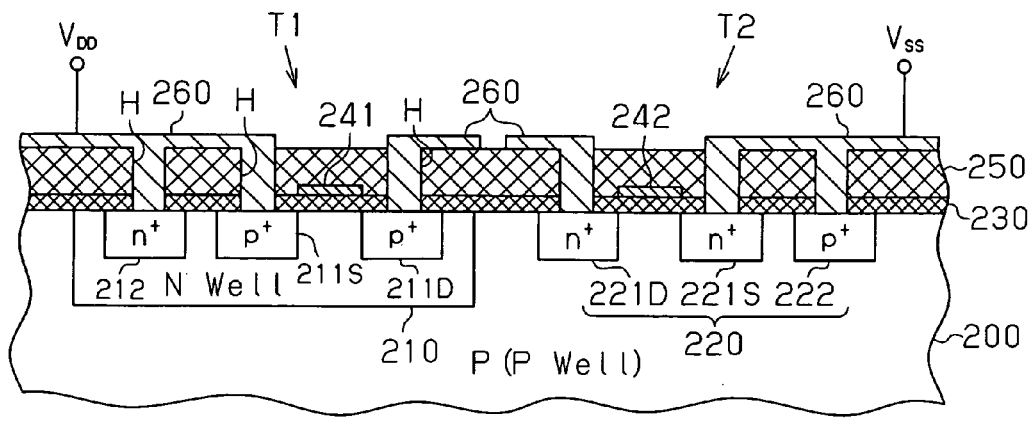
FIG. 1 is a partially enlarged cross-sectional view of a first example of a semiconductor integrated circuit device in the prior art.
Figure 2:
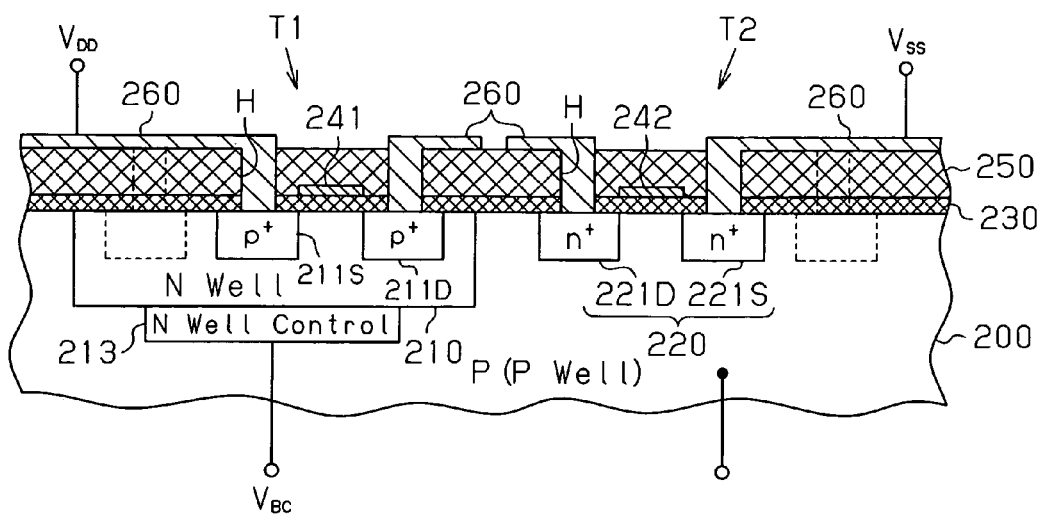
FIG. 2 is a partially enlarged cross-sectional view of a second example of a semiconductor integrated circuit device in the prior art.
Figure 3:
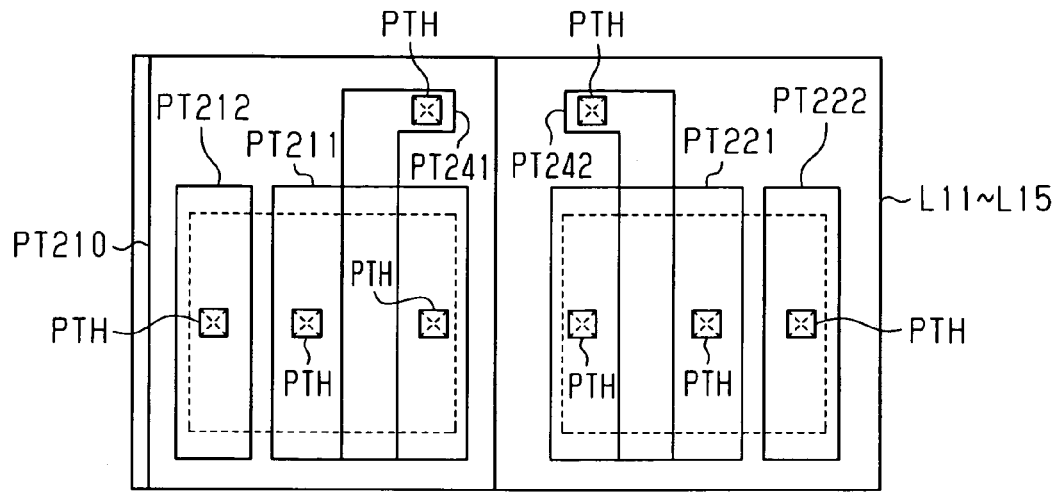
FIG. 3 is a pattern layout diagram of the semiconductor integrated circuit device of FIG. 1.

The pattern layout diagram of FIG. 7 is formed by superimposing a plurality of layers L0 to L5 shown in FIGS. 8(A) to 8(F). The pattern layout diagram shown in FIG. 7 used to layout design the semiconductor integrated circuit device of the preferred embodiment is generated using the pattern layout diagram illustrated in FIG. 3 to the maximum extent. The layout design procedures will now be described.

Figure 4A:
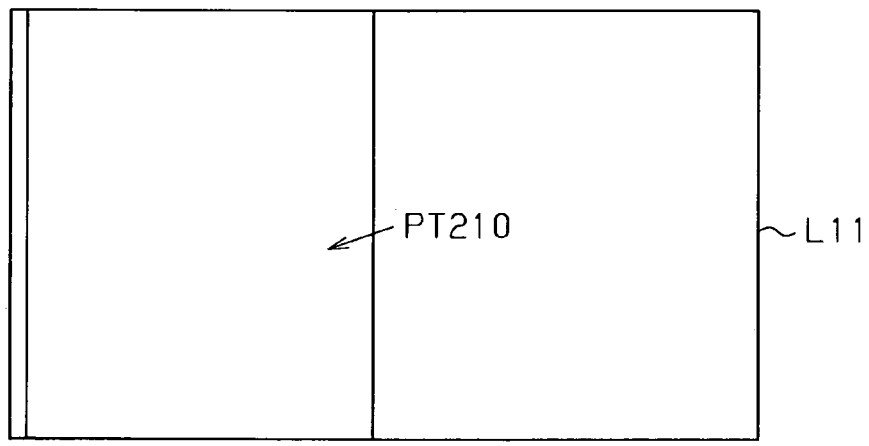
FIGS. 4(A) to 4(E) are plan views showing a plurality of layers forming the layout of FIG. 3.
Figure 4B:
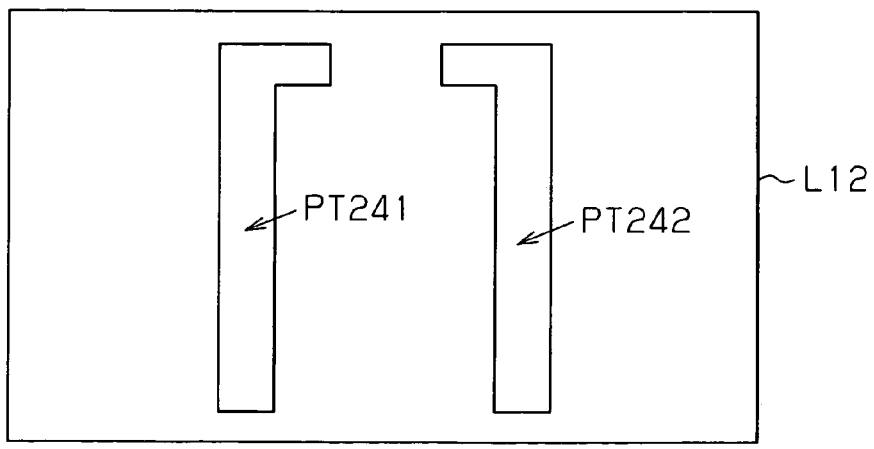
Figure 8A:
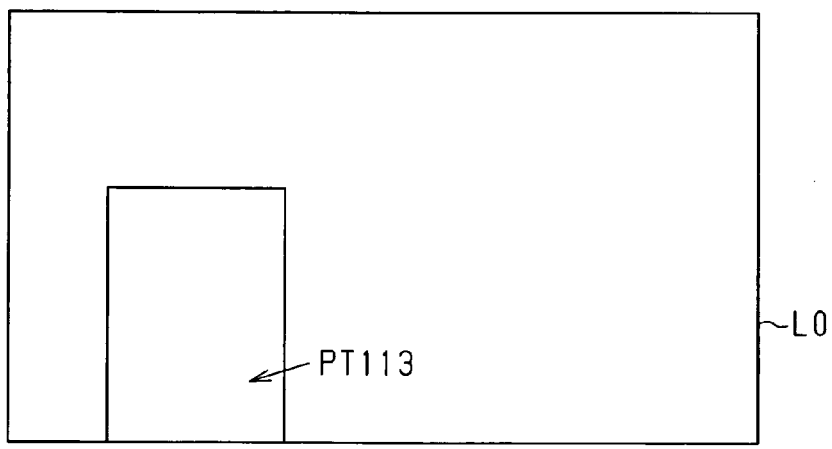
FIGS. 8(A) to 8(F) are plan views showing a plurality of layers that form the layout of FIG. 7.
Figure 8B:
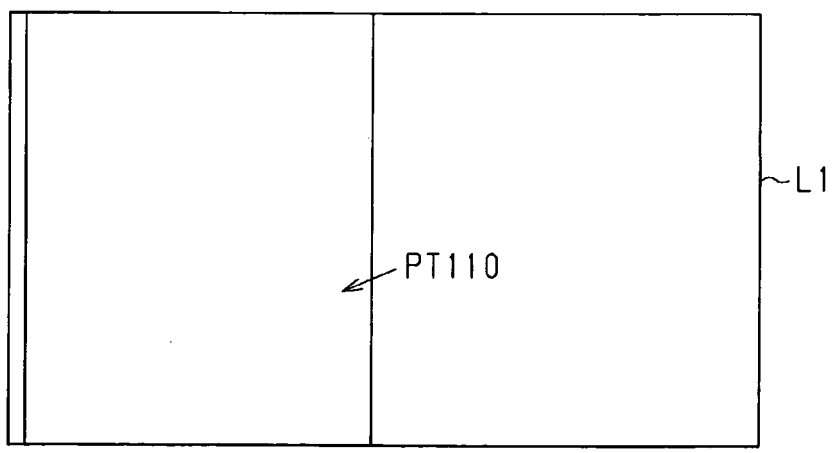
Figure 8C:
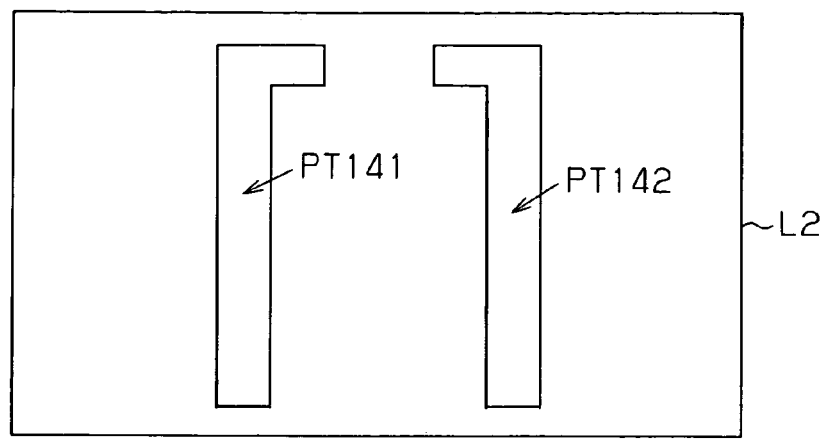

As shown in FIG. 8(A), the layer L0 including a layout pattern PT113 of the N well control layer 113 is first generated and laid out in the lowermost layer. The layer L1 (FIG. 8(B)) including layout pattern PT110 of the N well 110 is generated and superimposed on the layer L0. The layer L2 (FIG. 8(C)) including layout patterns PT141 and PT142 of the gate electrodes 141 and 142 is generated and superimposed on the layer L1. The layer L11 shown in FIG. 4A and the layer L12 shown in FIG. 4B may be used without corrections as the layers L1 and L2.

Figure 8D:
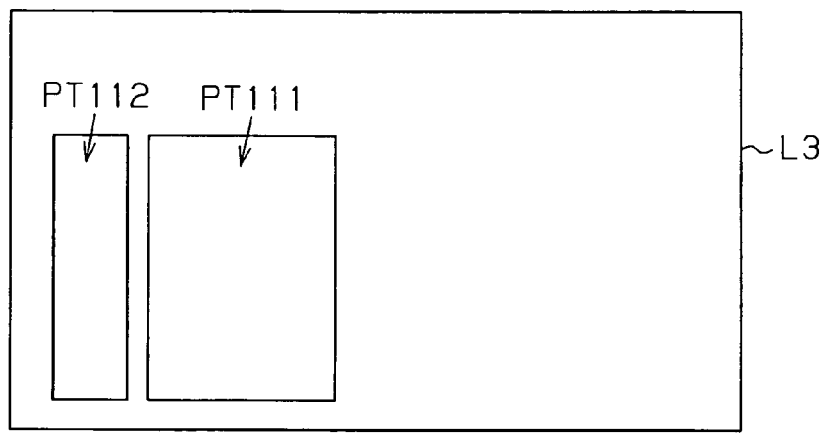

Next, the layer L3 (FIG. 8(D)) of the P⁺ diffusion layer region, which includes a layout pattern PT111 of the source and drain regions 111S and 111D of the PMOS transistor T1 and a layout pattern PT112 of the back gate diffusion region 112, is generated and superimposed on the layer L2. The layer L4 (FIG. 8E) of the N⁺ diffusion layer region, which includes a layout pattern PT121 of the source and drain regions 121S and 121D of the NMOS transistor T2 and a layout pattern PT122 of the back gate diffusion region 122, is generated and superimposed on the layer L3.

Figure 4C:
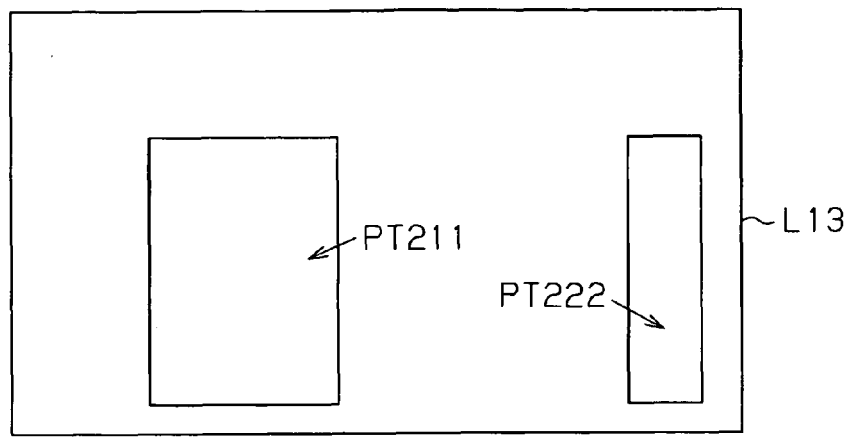
Figure 4D:
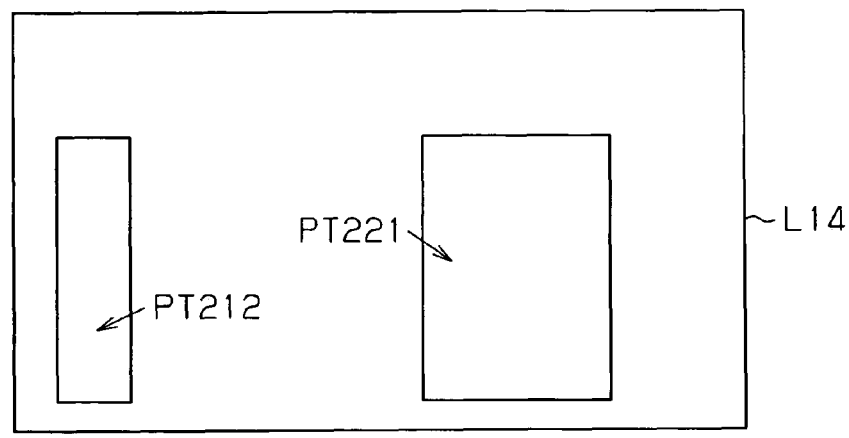
Figure 8E:
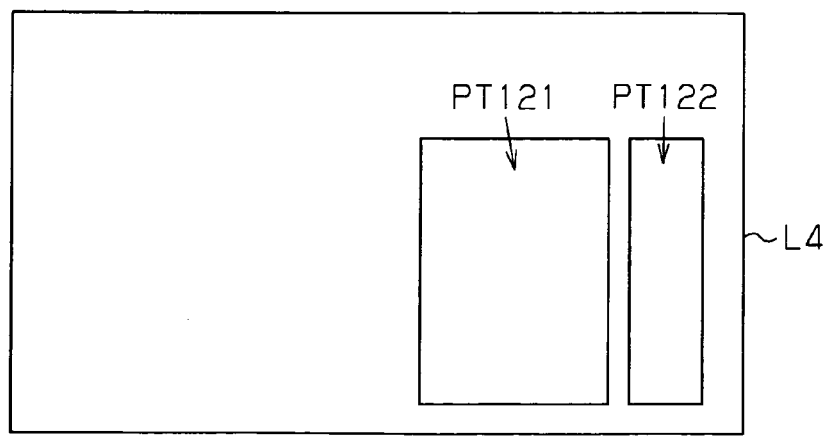

The layer L3 and the layer L4 may be generated by correcting part of the patterns formed on the layer L13 of FIG. 4(C) and the layer L14 of FIG. 4(D). For example, the layer L3 of FIG. 8(D) may be generated by moving the pattern PT212 in the layer L14 of FIG. 4(D) to the layer L13 of FIG. 4(C). The layer L4 of FIG. 8(E) is generated by moving the pattern PT222 in the layer L13 of FIG. 4(C) to the layer L14 of FIG. 4(D). The layers L3 and L4 of FIGS. 8(D) and 8(E) are thus generated with relative ease by correcting layout patterns in this manner.

Figure 4E:
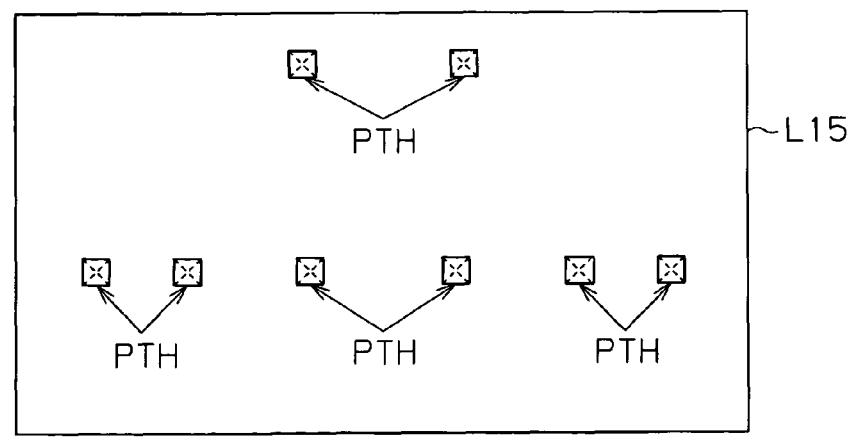
Figure 8F:
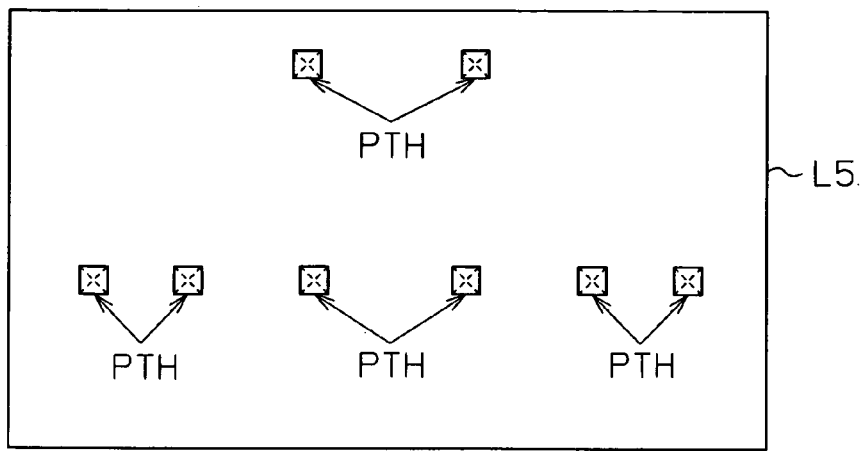

A layer L5 (FIG. 8(F)), which includes a plurality of layout patterns PTH respectively corresponding to the contact holes H, is generated and superimposed on the layer L4. The layer L15 of FIG. 4(E) may be used as the layer L5 without corrections. That is, all the contact holes H may be used by providing the dummy back gate diffusion regions 112 and 122. Thus, deletion and correction of the layout patterns PTH for forming the contact holes H become unnecessary. Therefore, the time required for layout design is shortened.

In the preferred embodiment, mask data is generated based on the pattern layout diagrams including corrected layers. However, the mask data may be corrected instead of using correcting layers.

The preferred embodiment has the advantages described below.

(1) The conductivity types of the back gate diffusion regions 112 and 122 respectively associated with the MOS transistors T1 and T2 are the same as the conductivity types of the source regions 111S and 121S. Thus, the back gate diffusion regions 112 and 122 do not sufficiently exhibit the function of a back gate (function for obtaining well bias and substrate bias). However, there is no need to delete the layout patterns PTH of the contact holes H connected to the back gate diffusion regions 112 and 122 from the pattern layout diagram during designing. This shortens the design time since layout correction is not performed. Thus, a semiconductor integrated circuit device enabling easy control of the substrate bias or the well bias is designed within a short period.

(2) The N well control layer 113 for independently controlling the well potential $V_{BC}$ is embedded under the N well 110. This ensures accurate control of the well potential $V_{BC}$ such that the well potential $V_{BC}$ may be controlled independently from the potential $V_{DD}$ applied to the source region 111S.

(3) The portion 125 functioning as the substrate potential control layer for independently controlling the substrate potential $V_{SC}$ is arranged in the semiconductor substrate 100. This accurately controls the substrate potential $V_{SC}$ such that the substrate potential $V_{SC}$ is controlled independently from the potential $V_{SS}$ applied to the source region 121S.

(4) The N well control layer 113 is embedded under the N well 110 so as to form a network. Thus, the well potential $V_{BC}$ of a vast number of PMOS transistors formed in the N well 110 are collectively controlled, and the controllability of the well potential $V_{BC}$ is significantly improved.

It should be apparent to those skilled in the art that the present invention may be embodied in many other specific forms without departing from the spirit or scope of the invention. Particularly, it should be understood that the present invention may be embodied in the following forms.

In the preferred embodiment, the back gate diffusion regions 112 and 122 are each arranged in the vicinity of the corresponding source regions 111S and 121S. The back gate diffusion regions 112 and 122 are electrically connected to the corresponding source regions 111S and 121S by the wiring 160. Alternatively, the back gate diffusion regions 112 and 122 may be arranged in the vicinity of the corresponding drain regions 111D and 121D. In this case, the back gate diffusion regions 112 and 122 are electrically connected to the corresponding drain regions 111D and 121D by the wiring 160.

In the preferred embodiment, a plurality of the N well control layers 113 are connected to one another so as to form a network. However, the present invention is not limited in such a manner, and potential may be separately supplied to each N well control layer 113. Further, the N well control layer 113 for controlling the potential of the N well 110 may be formed in the P-type region (P well) 120.

Figure 9:
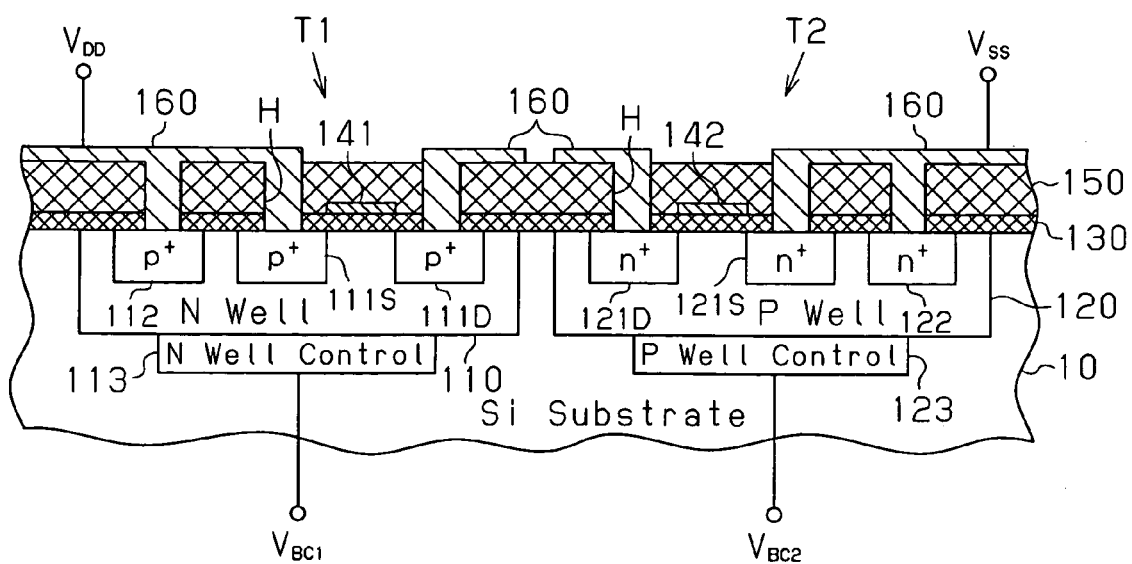
FIG. 9 is a partially enlarged cross-sectional view of a semiconductor integrated circuit device according to a further embodiment of the present invention.

In the preferred embodiment, the semiconductor integrated circuit device includes the CMOS transistor formed on the semiconductor substrate 100 of a P-type silicon. The present invention may also be applied to a semiconductor integrated circuit device including a CMOS transistor formed on a semiconductor substrate of an N-type silicon. Further, the preferred embodiment is directed to a single well MOS. However, the present invention may also be applied to a twin well MOS transistor. Moreover, the present invention may be applied to a triple well MOS transistor in which, for example, an N well is formed in a P-type silicon substrate, and a P well is formed in the N well. FIG. 9 shows a semiconductor integrated circuit device including a twin well MOS transistor. A silicon (Si) substrate 10 includes an N well 110 and a P well 120 formed next to the N well 110. A PMOS transistor T1 is formed in the N well 110, and an NMOS transistor T2 is formed in the P well 120. An N well control layer 113 for independently controlling well potential $V_{BC1}$ is formed under the N well 110. A P well control layer 123 for independently controlling well potential $V_{BC2}$ is formed under the P well 120.

In the preferred embodiment, the semiconductor integrated circuit device includes a CMOS transistor formed by the PMOS transistor T1 and the NMOS transistor T2. The present invention may also be applied to a semiconductor integrated circuit device including only either one of the PMOS transistor T1 and the NMOS transistor T2. Further, the present invention may be applied to a semiconductor integrated circuit device including a so-called BiCMOS transistor, which is a combination of a CMOS transistor and a bipolar transistor. The present invention may also be applied to an insulated gate bipolar transistor (IGBT) or a MOS transistor forming a memory, such as EEPROM, and a cell. Moreover, the present invention may be applied to a MOSFET (field effect transistor). Apparently, the present invention is applicable to any semiconductor integrated circuit device including a MOS transistor.

The present examples and embodiments are to be considered as illustrative and not restrictive, and the invention is not to be limited to the details given herein, but may be modified within the scope and equivalence of the appended claims.

What is claimed is:

1. A semiconductor integrated circuit device comprising:
   a semiconductor substrate;
   a MOS transistor formed in the semiconductor substrate, the MOS transistor including a source diffusion region and a drain diffusion region;
   a well formed in the semiconductor substrate;
   a back gate diffusion region defined in the vicinity of the source diffusion region or the drain diffusion region, the source diffusion region, the drain diffusion region and the back gate diffusion region being of the same conductivity type having the same impurity concentration and being formed in the same well, and the back gate diffusion region being electrically connected to the source diffusion region or the drain diffusion region via wiring; and
   a potential control layer, arranged in the semiconductor substrate or under the well, for controlling the potential at the semiconductor substrate or the well,
   wherein the back gate diffusion region is a dummy back gate diffusion region.

2. The semiconductor integrated circuit device according to claim 1, wherein:
   the well is of a first conductivity type;
   the back gate diffusion region, the source diffusion region, and the drain diffusion region are of a second conductivity type, which differs from the first conductivity type; and
   the potential control layer is embedded under the well.

3. The semiconductor integrated circuit device according to claim 1, wherein:
   the semiconductor substrate is of a first conductivity type;
   the well is of a second conductivity type, which differs from the first conductivity type;
   the back gate diffusion region, the source diffusion region, and the drain diffusion region include a first back gate diffusion region, a first source diffusion region, and a first diffusion region, which are formed in the well and which are of the first conductivity type;
   the semiconductor integrated circuit device further comprising a second back gate diffusion region, a second source diffusion region, and a second drain diffusion region, which are formed in a region adjacent to the well in the semiconductor substrate and which are of the second conductivity type, wherein the potential control layer includes:
a first potential control layer, embedded under the well, for controlling potential at the well; and
a second potential control layer, arranged in the semiconductor substrate, for controlling potential at the semiconductor substrate.

4. The semiconductor integrated circuit device according to claim 1, wherein:
the well is one of a plurality of wells including a first well of a first conductivity type and a second well of a second conductivity type, which differs from the first conductivity type, with the first and second wells formed alternately in the semiconductor substrate; and
the back gate diffusion region, the source diffusion region and the drain diffusion region includes:
a first back gate diffusion region, a first source diffusion region, and a first drain diffusion region, which are formed in the first well and which are of the second conductivity type; and
a second back gate diffusion region, a second source diffusion region, and a second drain diffusion region, which are formed in the second well and which are of the first conductivity type;
and wherein the potential control layer is one of a plurality of potential control layers including a first potential control layer embedded under the first well and a second potential control layer embedded under the second well.

5. The semiconductor integrated circuit device according to claim 1, wherein:
the well is one of a plurality of wells of at least two conductivity types;
the potential control layer is one of a plurality of potential control layers respectively associated with the plurality of wells; and
the potential control layers associated with the wells of the same conductivity type are electrically connected to one another in the semiconductor integrated circuit to form a network.

6. The semiconductor integrated circuit device according to claim 1, wherein:
the well is one of a plurality of wells including a plurality of first wells of a first conductivity type and a plurality of second wells of a second conductivity type;
the potential control layer is one of a plurality of potential control layers including a plurality of first potential control layers, respectively associated with the first plurality of wells, and a plurality of second potential control layers, respectively associated with the plurality of second wells;
the plurality of first potential control layers are electrically connected to one another in the semiconductor integrated circuit device; and
the plurality of second potential control layers are electrically connected to one another in the semiconductor integrated circuit device and electrically disconnected from the plurality of first potential control layers.

7. The semiconductor integrated circuit according to claim 6, wherein:
the plurality of first potential control layers are electrically connected to one another to form a first network in the semiconductor integrated circuit; and
the plurality of second potential control layers are electrically connected to one another to form a second network in the semiconductor integrated circuit, with the second network being electrically disconnected from the first network.

8. The semiconductor integrated circuit device according to claim 7, wherein:
the first network applies a first controlled potential to the plurality of first potential control layers; and
the second network applies a second controlled potential to the plurality of second potential control layers.

9. The semiconductor integrated circuit according to claim 1, wherein the MOS transistor is a field effect transistor.

10. The semiconductor integrated circuit according to claim 1, wherein the back gate diffusion region is electrically connected to the source diffusion region or the drain diffusion region by a contact hole and wiring.

11. The semiconductor integrated circuit according to claim 1, wherein the potential control layer is one of a plurality of potential control layers including:
a substrate potential control layer, formed in the semiconductor substrate, for controlling the potential at the semiconductor substrate; and
a well potential control layer, formed under the well, for controlling the potential at the well.

12. The semiconductor integrated circuit according to claim 1, wherein:
the well is one of a plurality of wells including an N well and a P well; and
the potential control layer is one of a plurality of potential control layers including:
an N well potential control layer, formed under the N well, for controlling the potential of the N well; and
a P well potential control layer, formed under the P well, for controlling the potential of the P well.

13. A semiconductor integrated circuit device comprising:
a semiconductor substrate;
a gate insulative film formed on the semiconductor substrate;
a gate electrode formed on the gate insulative film;
a well formed in the semiconductor substrate;
a source diffusion region, a drain diffusion region, and a back gate diffusion region defined in the same well, wherein the source diffusion region, the drain diffusion region, and the back gate diffusion region are of the same conductivity type having the same impurity concentration, and the back gate diffusion region is electrically connected to the source diffusion region or the drain diffusion region via wiring; and
a potential control layer, arranged under the well, for controlling the potential at the semiconductor substrate,
wherein the back gate diffusion region is a dummy back gate diffusion region.

14. The semiconductor integrated circuit according to claim 1, wherein the back gate diffusion region and the source diffusion region are electrically short-circuited.

* * * * *